(12) United States Patent
Zhang et al.

(10) Patent No.: US 12,063,818 B2
(45) Date of Patent: Aug. 13, 2024

(54) DISPLAY SUBSTRATE, FABRICATION METHOD THEREOF AND DISPLAY PANEL

(71) Applicants: Chengdu BOE Optoelectronics Technology Co., Ltd., Sichuan (CN); BOE TECHNOLOGY GROUP CO., LTD., Beijing (CN)

(72) Inventors: Yuanqi Zhang, Beijing (CN); Yi Zhang, Beijing (CN); Fengli Ji, Beijing (CN); Shun Zhang, Beijing (CN); Ping Wen, Beijing (CN); Yongjie Song, Beijing (CN)

(73) Assignees: Chengdu BOE Optoelectronics Technology Co., Ltd., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 417 days.

(21) Appl. No.: 17/432,549

(22) PCT Filed: Oct. 15, 2020

(86) PCT No.: PCT/CN2020/121239
§ 371 (c)(1),
(2) Date: Aug. 20, 2021

(87) PCT Pub. No.: WO2022/052204
PCT Pub. Date: Mar. 17, 2022

(65) Prior Publication Data
US 2022/0344420 A1    Oct. 27, 2022

(30) Foreign Application Priority Data

Sep. 10, 2020   (WO) ................ PCT/CN2020/114589

(51) Int. Cl.
*H10K 59/122*    (2023.01)
*H10K 59/12*     (2023.01)
(Continued)

(52) U.S. Cl.
CPC ....... *H10K 59/122* (2023.02); *H10K 59/1213* (2023.02); *H10K 59/131* (2023.02); *H10K 59/1201* (2023.02)

(58) Field of Classification Search
CPC ............. H10K 59/122; H10K 59/1213; H10K 59/131; H10K 59/1201; H10K 59/352;
(Continued)

(56) References Cited

U.S. PATENT DOCUMENTS

| | | |
|---|---|---|
| 2020/0006697 A1 | 1/2020 | Jung |
| 2020/0258964 A1 | 8/2020 | Kim et al. |
| 2022/0223667 A1* | 7/2022 | Choi ................... H10K 50/865 |

FOREIGN PATENT DOCUMENTS

| | | |
|---|---|---|
| CN | 110767736 A | 2/2020 |
| CN | 110783387 A | 2/2020 |
| CN | 110867470 A | 3/2020 |

* cited by examiner

*Primary Examiner* — Mohammad A Rahman
(74) *Attorney, Agent, or Firm* — HOUTTEMAN LAW LLC

(57) ABSTRACT

The present disclosure provides a display substrate, a fabrication method thereof and a display panel. The display substrate includes a substrate; and a pixel defining layer on the substrate. The display substrate further comprises a display area, a non-display area and a light-transmitting area, the display area and the non-display area at least partially surround the light-transmitting area, the pixel defining layer extends from the display area to the non-display area, the pixel defining layer is provided with a first opening, the first opening comprises a plurality of first sub-openings and a plurality of second sub-openings, the plurality of first sub-openings are in the display area, the plurality of second sub-openings are in the non-display area,
(Continued)

and the plurality of second sub-openings are closer to the light-transmitting area than the plurality of first sub-openings.

18 Claims, 12 Drawing Sheets

(51) Int. Cl.
*H10K 59/121* (2023.01)
*H10K 59/131* (2023.01)

(58) Field of Classification Search
CPC ...... H10K 59/353; H10K 59/40; H01L 27/32; H01L 51/56; H01L 51/52
See application file for complete search history.

DISPLAY SUBSTRATE, FABRICATION METHOD THEREOF AND DISPLAY PANEL

CROSS-REFERENCE TO RELATED APPLICATIONS

This is a National Phase Application filed under 35 U.S.C. 371 as a national stage of PCT/CN2020/121239, filed on Oct. 15, 2020, an application claiming priority to Chinese patent application PCT/CN2020/114589, filed on Sep. 10, 2020, the disclosure of which is incorporated herein by reference.

TECHNICAL FIELD

The present disclosure relates to the field of display technology, and particularly relates to a display substrate, a fabrication method thereof and a display panel.

BACKGROUND

An organic light-emitting diode (OLED) display panel fabricated by OLED technology has become a mainstream development direction in the field of display technology, due to its advantages such as self-luminescence, high brightness, good image quality, and low energy consumption. For the newly developed technology, more designs can be made to meet people's demand, and the punching technology for a display area of a screen is one direction of the current screen development.

SUMMARY

The embodiment of the present disclosure provides a display substrate, a fabrication method thereof and a display panel.

In a first aspect, an embodiment of the present disclosure provides a display substrate, including:
a substrate; and
a pixel defining layer on the substrate, wherein
the display substrate further includes a display area, a non-display area and a light-transmitting area, the display area and the non-display area at least partially surrounding the light-transmitting area,
the pixel defining layer extends from the display area to the non-display area, and
the pixel defining layer is provided with a first opening therein, the first opening includes a plurality of first sub-openings and a plurality of second sub-openings, the plurality of first sub-openings are in the display area, the plurality of second sub-openings are in the non-display area, and the plurality of second sub-openings are closer to the light-transmitting area than the plurality of first sub-openings.

In some embodiments, the plurality of first sub-openings each are provided with a first electrode layer and a light-emitting function layer therein;
the substrate includes a pixel circuit, the pixel circuit including a driving transistor electrically coupled to the first electrode layer;
the first electrode layer and the light-emitting function layer are stacked in a direction away from the substrate;
the plurality of second sub-openings each are provided with the light-emitting function layer therein;
the display substrate further includes a second electrode layer on a side of the pixel defining layer away from the substrate, and the second electrode layer covers the plurality of first sub-openings and the plurality of second sub-openings; and
an orthographic projection of the driving transistor on the substrate does not overlap with an orthographic projection of each of the plurality of second sub-openings on the substrate.

In some embodiments, the display substrate further includes a signal line on a side of the pixel defining layer close to the substrate, the signal line extending from the display area to the non-display area, and the signal line including an arc portion in the non-display area; and
the arc portion is at least partially around the light-transmitting area, and an orthographic projection of the arc portion on the substrate at least partially overlaps with an orthographic projection of the second sub-opening on the substrate.

In some embodiments, the signal line includes a data line.

In some embodiments, a width of a distribution area of the plurality of second sub-openings along a radial direction of the light-transmitting area is in a range of 2 to 8 times a width of the plurality of second sub-openings along the radial direction.

In some embodiments, the display substrate further includes a partition in the non-display area and at least partially surrounding the light-transmitting area;
the partition surrounds the light-transmitting area at an edge of the light-transmitting area, and the plurality of second sub-openings surround the partition and are on a side of the partition away from the light-transmitting area; and
a shortest distance between the partition and a distribution area of the plurality of second sub-openings is more than 0 and less than 300 microns.

In some embodiments, display substrate further includes a touch film layer on a side of the second electrode layer away from the substrate, wherein
the touch film layer includes a touch electrode in a grid shape, and an orthographic projection of the touch electrode on the substrate at least partially overlaps with an orthographic projection of the pixel defining layer on the substrate.

In some embodiments, the orthogonal projection of the touch electrode on the substrate at least partially overlaps with an orthogonal projection of the pixel defining layer, between the plurality of second sub-openings, on the substrate.

In some embodiments, a size difference between the first sub-opening and the second sub-opening is smaller than a set threshold.

In some embodiments, the plurality of second sub-openings include a first-shape opening, a second-shape opening, and a third-shape opening;
the first-shape, second-shape, and third-shape openings have different sizes; and
two first-shape openings, one second-shape opening, and one third-shape opening constitute one opening period, and a plurality of the opening periods are in the non-display area.

In some embodiments, in the opening period,
a distance between two first-shape openings ranges from 6 μm to 27 μm;
a distance between the first-shape opening and the second-shape opening ranges from 15 μm to 30 μm;
a distance between the second-shape opening and the third-shape opening ranges from 15 μm to 30 μm; and
a distance between the first-shape opening and the third-shape opening ranges from 50 μm to 80 μm.

In some embodiments, the distance between the first-shape opening and the third-shape opening is 1.5 to 2.5 times the distance between the first-shape opening and the second-shape opening;

the distance between the first-shape opening and the second-shape opening is 0.8 to 1.2 times the distance between the second-shape opening and the third-shape opening; and the distance between two first-shape openings is 0.6 to 1 times the distance between the first-shape opening and the second-shape opening.

In some embodiments, the plurality of first sub-openings and the plurality of second sub-openings are arranged with a same uniformity.

In some embodiments, the display area surrounds the non-display area at a periphery of the non-display area; or the non-display area is at a corner of the display area; or the non-display area is at an edge of the display area.

In some embodiments, the display substrate further includes a planarization layer on a side of the pixel defining layer close to the substrate, wherein the substrate further includes a base, the pixel circuit is on the base, the planarization layer is provided with a via hole therein, and the first electrode layer is coupled to the driving transistor in the pixel circuit through the via hole.

In a second aspect, an embodiment of the present disclosure further provides a display panel, which includes the display substrate described above.

In a third aspect, an embodiment of the present disclosure further provides a method for fabricating a display substrate, including:

preparing a substrate; and forming a pixel defining layer on the substrate, wherein the display substrate further includes a display area, a non-display area and a light-transmitting area, the display area and the non-display area at least partially surrounds the light-transmitting area, and the pixel defining layer extends from the display area to the non-display area;

forming the pixel defining layer includes: forming a pattern of the pixel defining layer, and forming a first opening in the pixel defining layer; and the first opening includes a plurality of first sub-openings and a plurality of second sub-openings, the plurality of first sub-openings are in the display area, the plurality of second sub-openings are in the non-display area, and the plurality of second sub-openings are closer to the light-transmitting area than the plurality of first sub-openings.

In some embodiments, the pattern of the pixel defining layer and a pattern of the first opening are formed by a single patterning process.

BRIEF DESCRIPTION OF THE DRAWINGS

The accompanying drawings, which constitute a part of the specification, are to provide a further understanding of embodiments of the present disclosure, and to explain the present disclosure together with embodiments of the present disclosure but not to limit the present disclosure. The above and other features and advantages will become more apparent to those skilled in the art by describing in detail exemplary embodiments with reference to the accompanying drawings, in which.

REFERENCE NUMERALS

Figure 1:
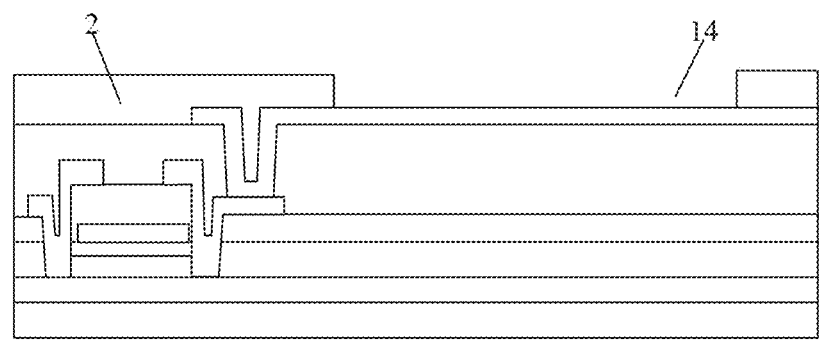
FIG. 1 is a cross-sectional view of a partial structure of an OLED display panel in which an opening is formed in a pixel defining layer in a display area according to prior art.

1—substrate; 11—base; 12—pixel circuit; 2—pixel defining layer; 21—first opening; 211—first sub-opening; 212—second sub-opening; 23—first groove; 24—partition; 101—display area; 102—non-display area; 103—light-transmitting area; 100—boundary; 3—first electrode layer; 4—light-emitting function layer; 5—second electrode layer; 6—touch film layer; 61—insulating layer; 611—first inorganic encapsulation layer; 612—organic encapsulation layer; 613—second inorganic encapsulation layer; 614—inorganic buffer layer; 62—touch electrode; 620—bridge structure; 621—first insulating layer; 622—touch electrode pattern; 7—planarization layer; 70—via hole; 71—first planarization layer; 72—second planarization layer; 8—hole; 9—sub-pixel opening; 10—touch electrode pattern; 13—groove; 14—opening; 15—signal line; 150—data line; 151—scanning line; 16—isolation pillar; 17—buffer layer; 18—active layer; 19—first gate insulating layer; 20—gate electrode; 25—first scanning line; 26—second gate insulating layer; 27—second scanning line; 28—intermediate dielectric layer; 29—source electrode; 30—drain electrode; 31—passivation layer; 32—conductive layer; 33—support layer; 34—first-shape opening; 35—second-shape opening; 36—third-shape opening; 37—opening period.

DETAILED DESCRIPTION

In order to make those skilled in the art better understand the technical solutions of the embodiments of the present disclosure, the following description of a display substrate, a fabrication method thereof, and a display panel according to the embodiments of the present disclosure will be given in further detail with reference to the accompanying drawings and the specific embodiments.

The embodiments of the present disclosure will be described more fully hereinafter with reference to the accompanying drawings, but the embodiments shown may be implemented in different forms and the present disclosure should not be construed as being limited to the embodiments set forth herein. Rather, these embodiments are provided so that the present disclosure will be thorough and complete, and will fully convey the scope of the present disclosure to those skilled in the art.

The embodiments of the present disclosure are not limited to the embodiments shown in the drawings, but include modifications of configurations formed based on a manufacturing process. Thus, the areas illustrated in the figures are schematic, and the shapes of the areas shown in the figures exemplify specific shapes of the areas, but are not intended to be limiting.

Due to the advantages such as self-luminescence, high brightness, good image quality, and low energy consumption, an organic light-emitting diode (OLED) display panel based on OLED technology has become a mainstream development direction in the field of display technology.

The function of an opening defined by a pixel defining layer in the OLED display panel is to determine an evaporation area for each sub-pixel; meanwhile, the pixel defining layer plays a planarization role and is prepared for evaporating film layers in subsequent processes. In common design, openings are formed in a pixel defining layer of a display area of the OLED display panel, and then light-emitting materials of red, green, and blue sub-pixels are formed by evaporation on anodes at the openings. The cathode and the anode on both sides of the light-emitting material layer respectively provide electrons and holes for recombination to emit light in the light-emitting material layer. A cross section of an opening 14 in the pixel defining layer 2 in the display area is as shown in FIG. 1, and each film layer of a backplane of the OLED display panel is below the pixel defining layer 2.

Figure 2:
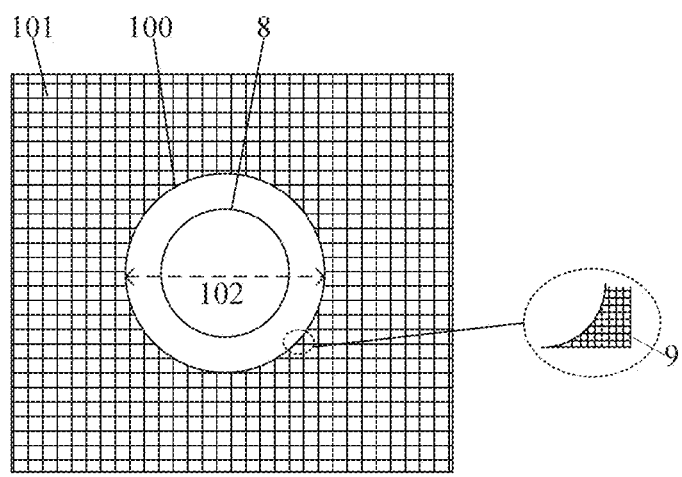
FIG. 2 is a top view of a structure of an OLED screen in which a hole is formed in a display area according to prior art.
Figure 3:
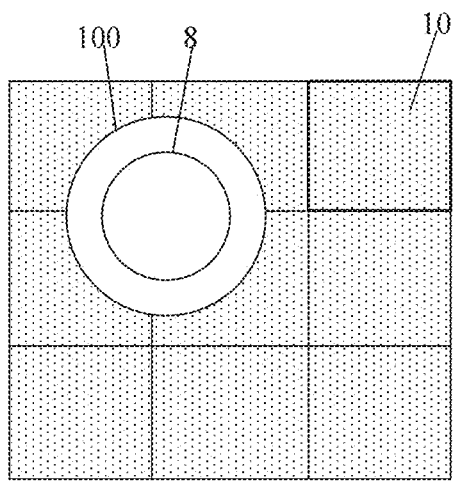
FIG. 3 is a top view of a structure of touch electrode patterns of an OLED screen when forming a hole in a display area according to prior art.
Figure 4:
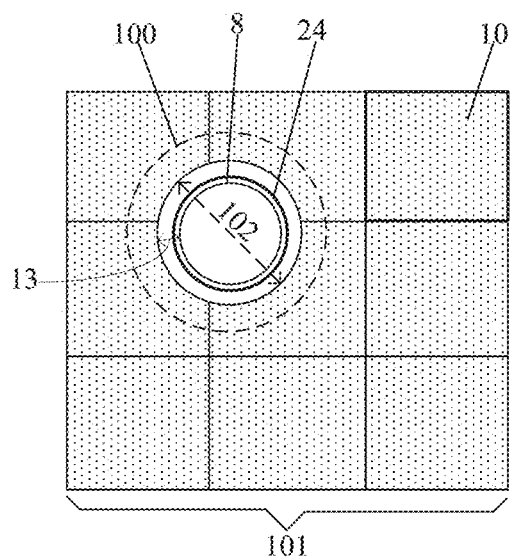
FIG. 4 is a top view of a structure of touch electrode patterns, which are distributed and extended out from a display area, of an OLED screen when forming a hole in the display area according to prior art.

For the newly developed OLED display technology, more designs can be made to meet the requirements of people. The punching technology for a display area of a screen (that is, a technology in which a hole penetrating the display area of the screen is formed) is a direction of the current screen development, and is used for arranging an under-screen detection device such as a camera. As shown in FIG. 2, one problem of the technology in which a hole 8 penetrating the display area 101 of the screen is formed is that: because the openings 9 for sub-pixels are formed in the pixel defining layer 2 of the display area 101 only, the sizes of the openings 9 for sub-pixels at the boundary 100 between the non-display area 102 where the hole 8 is positioned and the display area 101 of the screen are not uniform, and the display effect of the screen will be influenced; for a screen integrated with a touch film layer, another problem caused by the punching technology for a display area of a screen is that the integrity of the touch electrode patterns 10 at the hole 8 cannot be ensured, and as shown in FIG. 3, the four touch electrode patterns 10 around the hole 8 are obviously incomplete. In order to improve the integrity of the touch electrode patterns 10 around the hole 8, as shown in FIG. 4, a solution is to extend the boundary of the touch electrode patterns 10 to an area of the hole 8 other than the boundary 100 between the display area 101 and the non-display area 102, which requires that the film layer below the touch electrode at the hole 8 is relatively flat, so as to avoid the occurrence of poor wiring of the touch electrode. However, in order to form a partition 24 at the hole 8, it is necessary to form a groove 13 in the pixel defining layer (and a planarization layer under the pixel defining layer) at the hole 8, and the groove 13 makes the pixel defining layer uneven. In order to ensure good wiring of the touch electrode, it is necessary to ensure that the groove 13 in the pixel defining layer (and the planarization layer under the pixel defining layer) is as far from the display area 101 as possible to ensure that the touch electrode is not over the groove 13 in the pixel defining layer. In a case where the groove in the pixel defining layer is far away from the display area, the area of the pixel defining layer maintained between the groove and boundary of the display area is relatively large. Since gas may be released outwards from the internal film layer during and after the process of the display panel, the large area of the pixel defining layer maintained between the groove and boundary of the display area may result in that the gas released from the internal film layer cannot be discharged timely from the groove of the pixel defining layer, and therefore the released gas may be present between certain internal film layers to form small gaps or small cavities, which results in that the film layers can easily absorb water vapor to generate defects in the fabricating process.

In view of a series of problems caused by the punching technology for a display area of a screen, embodiments of the present disclosure provide a display substrate, a fabrication method thereof, and a display panel.

Figure 5:
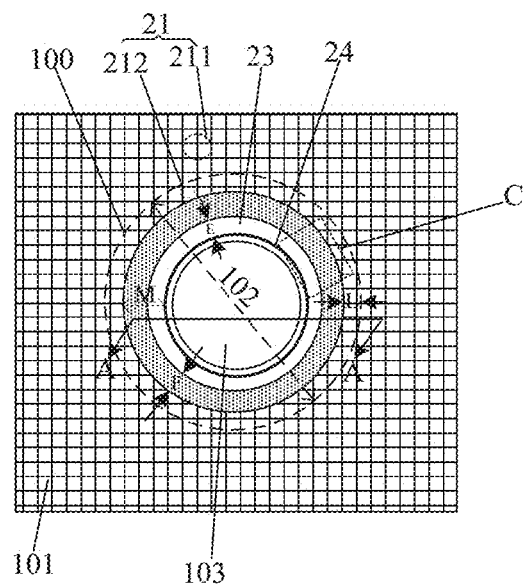
FIG. 5 is a top view of a structure of a display substrate according to an embodiment of the present disclosure.
Figure 6:
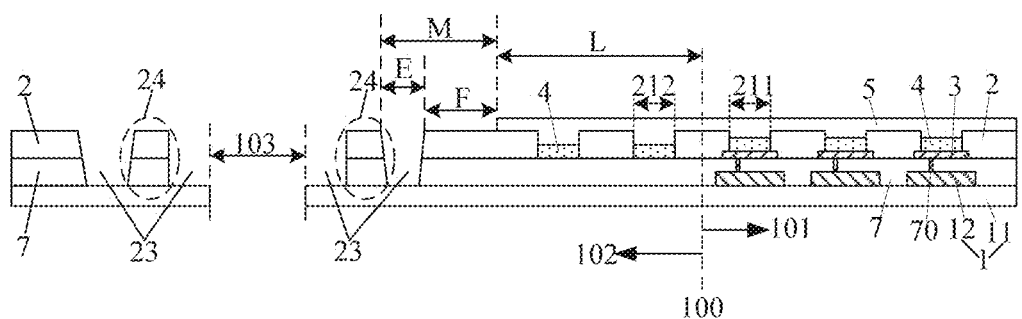
FIG. 6 is a cross-sectional view of a structure of the display substrate shown in FIG. 5 taken along line AA.

An embodiment of the present disclosure provides a display substrate, as shown in FIGS. 5 and 6, including: a substrate 1 and a pixel defining layer 2 disposed on the substrate 1. The display substrate further includes a display area 101, a non-display area 102 and a light-transmitting area 103, and the display area 101 and the non-display area 102 at least partially surround the light-transmitting area 103. The pixel defining layer 2 extends from the display area 101 to the non-display area 102. A first opening 21 is formed in the pixel defining layer 2, and the first opening 21 includes a plurality of first sub-openings 211 and a plurality of second sub-openings 212. The plurality of first sub-openings 211 are distributed in the display area 101, the plurality of second sub-openings 212 are distributed in the non-display area 102, and the second sub-opening 212 is closer to the light-transmitting area 103 than the first sub-opening 211.

The first sub-openings 211 distributed in the display area 101 are used for arranging sub-pixels therein. The light-transmitting area 103 corresponds to the hole formed in the display substrate, and the hole is used for arranging an under-screen detection device, such as a camera, a fingerprint identification sensor, and the like. The positional relationship between the display area 101 and the non-display area 102 may be: the display area 101 surrounds the periphery of the non-display area 102; or, the non-display area 102 is located at one corner of the display area 101; or, the non-display area 102 is located at an edge of the display area 101, or the like.

The display substrate is formed such that the first opening is formed in the pixel defining layer 2 with a plurality of first sub-openings 211 in the display area 101 and a plurality of second sub-openings 212 in the non-display area 102, and the second sub-openings 212 being closer to the light-transmitting area 103 than the first sub-openings 211. Compared with the case where the sub-pixel openings are formed in the pixel defining layer in the display area only in the prior art, the second sub-openings 212 are formed in the portion of the pixel defining layer 2 extending to the non-display area 102 in the embodiments, so that the openings in the pixel defining layer 2 can be spread and distributed to the area of the non-display area 102 at the boundary 100 between the non-display area 102 and the display area 101, thereby ensuring that the sizes of the first sub-openings 211 at the boundary 100 between the display area 101 and the non-display area 102 are uniform, that is, the sizes of the first sub-openings 211 at the boundary 100 are the same as the sizes of the first sub-openings 211 in the display area 101, and ensuring the display effect of the display substrate.

In some embodiments, the first sub-opening 211 has a first electrode layer 3 and a light-emitting function layer 4 disposed therein. The substrate 1 includes a pixel circuit 12, the pixel circuit 12 includes a driving transistor, and the driving transistor is electrically coupled to the first electrode layer 3. The first electrode layer 3 and the light-emitting function layer 4 are stacked in a direction away from the substrate 1, and the second sub-opening 212 has the light-emitting function layer 4 disposed therein. The display substrate further includes a second electrode layer 5, the second electrode layer 5 is disposed on a side of the pixel defining layer 2 away from the substrate 1, the second electrode layer 5 covers the first sub-openings 211 and the second sub-openings 212, and an orthographic projection of the driving transistor on the substrate 1 and an orthographic projection of the second sub-opening 212 on the substrate 1 do not overlap. The first electrode layer 3 and the light-emitting function layer 4 in the first sub-opening 211 of the display area 101 and the second electrode layer 5 disposed on the pixel defining layer 2 are stacked to form one sub-pixel, and in response to the sub-pixel being driven by the pixel circuit 12, the first electrode layer 3 and the second electrode layer 5 may respectively provide holes and electrons, and the holes and the electrons are recombined in the light-emitting function layer 4 to emit light, that is, the sub-pixel in the first sub-opening 211 can normally emit light to perform display. However, only the light-emitting function layer 4 is disposed in the second sub-opening 212 in the non-display area 102, and the second electrode layer 5 covers the light-emitting function layer 4. Since the first electrode layer 3 is absent in the second sub-opening 212 in the non-display area 102, the area of the second sub-opening 212 in the non-display area 102 does not emit light, and thus the requirement that the second sub-openings 212 in the non-display area 102 do not emit light can be met.

In some embodiments, the light-emitting function layer 4 in the second sub-opening 212 of the non-display area 102 may have the same film structure as the light-emitting function layer 4 in the first sub-opening 211 of the display area 101. Alternatively, the light-emitting function layer 4 in the second sub-opening 212 of the non-display area 102 may also have a part of the film structure of the light-emitting function layer 4 in the first sub-opening 211 of the display area 101. For example, the light-emitting function layer 4 in the first sub-opening 211 of the display area 101 includes a hole injection layer, a hole transport layer, a light-emitting layer, an electron transport layer, and an electron injection layer, and the light-emitting function layer in the second sub-opening 212 of the non-display area 102 may include only two (e.g., the light-emitting layer and the hole injection layer), three, or four layers among these five film layers.

In some embodiments, the display substrate further includes a planarization layer 7, and the planarization layer 7 is disposed on a side of the pixel defining layer 2 close to the substrate 1. The substrate 1 further includes a base 11, the pixel circuit 12 is disposed on the substrate 11, a via hole 70 is formed in the planarization layer 7, and the first electrode layer 3 is coupled to the driving transistor in the pixel circuit 12 through the via hole 70.

Figure 7:
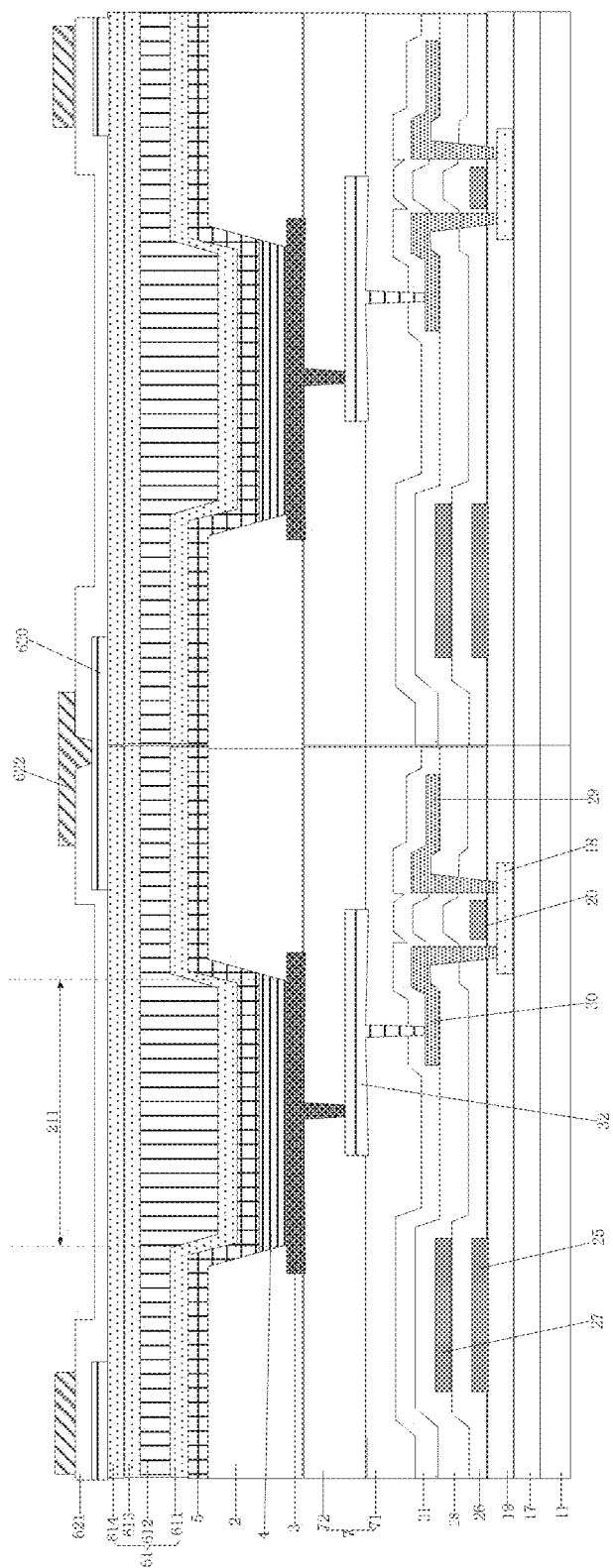
FIG. 7 is a cross-sectional view of a partial structure of a display area of a display substrate according to an embodiment of the present disclosure.
Figure 8:
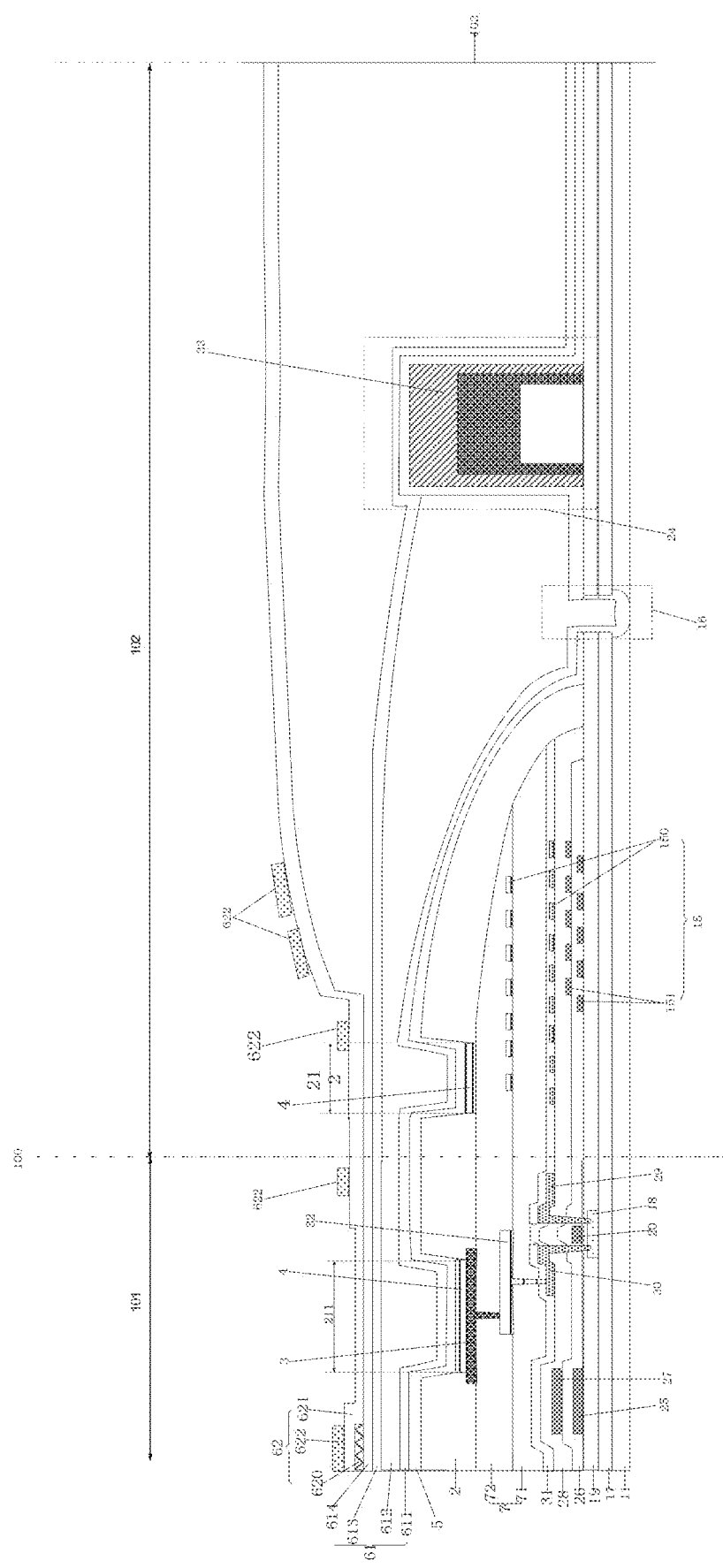
FIG. 8 is a schematic cross-sectional view of a partial structure of a display substrate from a display area to a non-display area according to an embodiment of the present disclosure.

In some embodiments, as shown in FIGS. 7 and 8, the pixel circuit includes a buffer layer 17 and a transistor circuit sequentially stacked on the substrate 11. The transistor circuit includes a plurality of transistors (including the driving transistor), a storage capacitor, and a plurality of signal lines coupled to the transistors. The transistor circuit includes an active layer 18, a first gate insulating layer 19, a gate electrode 20 and a first scanning line 25 in the same layer, a second gate insulating layer 26, a second scanning line 27, an intermediate dielectric layer 28, a source electrode 29 and a drain electrode 30 in the same layer, and a passivation layer 31 sequentially stacked on the buffer layer 17. The source electrode 29 and the drain electrode 30 are respectively located at two opposite ends of the active layer 18, and the source electrode 29 and the drain electrode 30 are respectively coupled to the active layer 18 through via holes formed in the interlayer dielectric layer 28, the second gate insulating layer 26 and the first gate insulating layer 19.

In some embodiments, the planarization layer 7 includes two layers, i.e., a first planarization layer 71 and a second planarization layer 72, the first planarization layer 71 and the second planarization layer 72 are sequentially stacked on the passivation layer 31, a conductive layer 32 may be further disposed between the first planarization layer 71 and the second planarization layer 72, the first electrode layer 3 is coupled to the conductive layer 32 through a via hole formed in the second planarization layer 72, and the conductive layer 32 is coupled to the drain electrode 30 of the transistor through a via hole formed in the first planarization layer 71 and the passivation layer 31. The first scanning line 25 is a gate line, and the second scanning line 27 is a light-emitting control signal line.

In some embodiments, the pixel circuit may be a 2T1C driving circuit, a 7T1C driving circuit, or the like.

In some embodiments, an insulating layer 61 is further provided on a side of the second electrode layer 5 away from the substrate, and the insulating layer 61 includes a first inorganic encapsulation layer 611, an organic encapsulation layer 612, a second inorganic encapsulation layer 613, and an inorganic buffer layer 614 sequentially stacked. The insulating layer 61 encapsulates the first sub-opening 211 and the second sub-opening 212.

In some embodiments, each film layer of the display substrate corresponding to the area where the light-transmitting area 103 is located is removed, that is, the light-transmitting area 103 of the display substrate is correspondingly provided with a through hole; or, only the substrate 11 is reserved in the area corresponding to the light-transmitting area 103 on the display substrate, and all other film layers in the area are removed; or, the opaque metal film layer of the display substrate corresponding to the area of the light-transmitting area 103 is removed, and the rest transparent film layer is remained.

Figure 9:
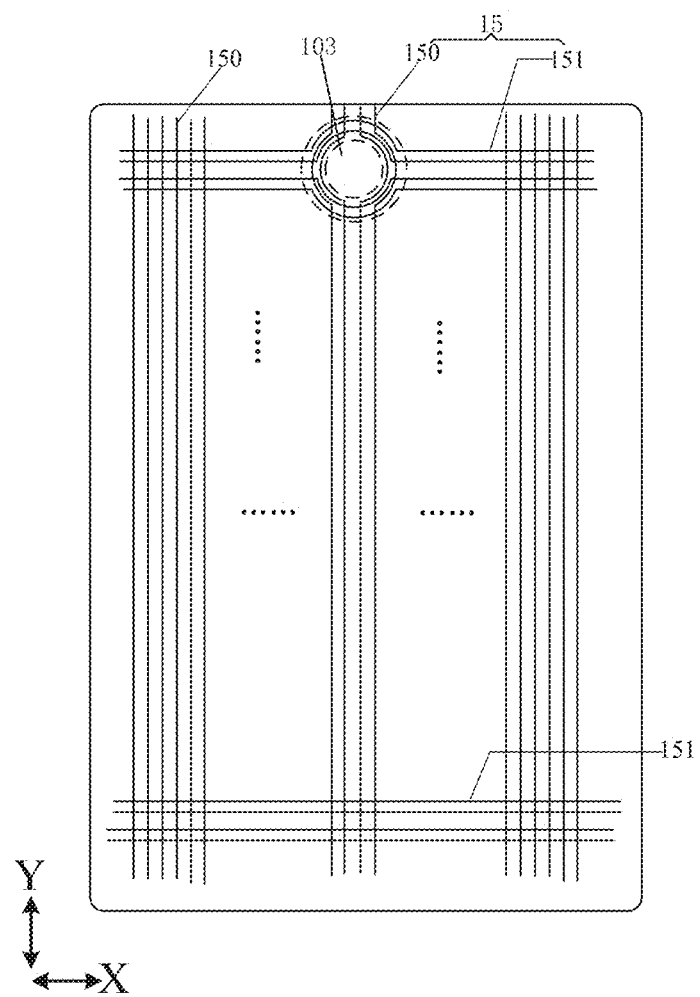
FIG. 9 is a schematic top view of a structure of an arc portion of a signal line in a display substrate according to an embodiment of the present disclosure.
Figure 10:
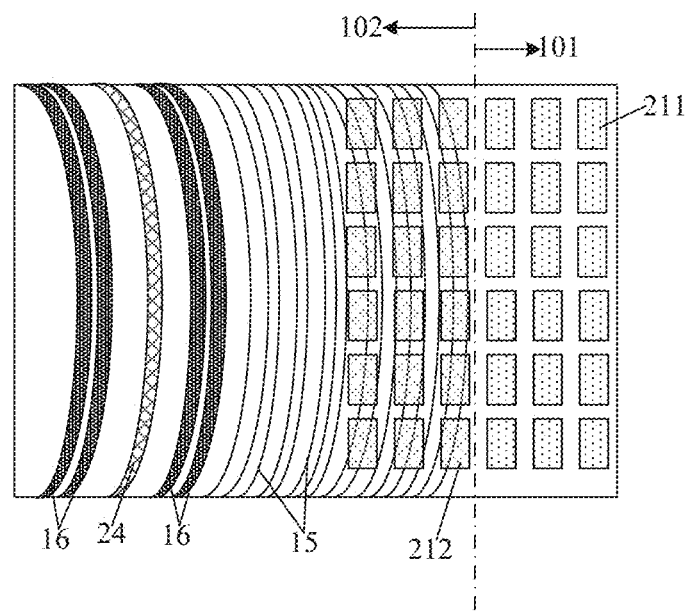
FIG. 10 is a schematic enlarged top view of a structure of a portion C of the display substrate shown in FIG. 5.

In some embodiments, as shown in FIGS. 9 and 10, the display substrate further includes signal lines 15, the signal lines 15 are disposed on a side of the pixel defining layer close to the substrate, and the signal lines 15 extend from the display area 101 to the non-display area 102. The signal line 15 includes an arc portion in the non-display area 102, the arc portion is disposed at least partially around the light-transmitting area 103, and the arc portion at least partially overlaps with an orthographic projection of the second sub-opening 212 on the substrate. Because the light-transmitting area 103 is disposed, part of the signal lines 15 in the substrate cannot extend in an original extending direction, and around the light-transmitting area 103, the part of the signal lines 15 passing the light-transmitting area 103 needs to be wound around the light-transmitting area 103, thus forming the arc portion of the signal line 15. At least part of the signal lines 15 passes the area under the orthographic projection of the second sub-opening 212. The case that the signal line 15 passes under the second sub-opening 212 would have no influence on the second sub-opening 212, because the area of the second sub-opening 212 does not emit light and display. No signal line passes under the orthographic projection of the first sub-opening 211 of the display area 101.

In some embodiments, the signal lines 15 include data lines 150. Because the light-transmitting area 103 is disposed, part of the data lines 150 in the substrate cannot normally extend in the vertical direction, and around the light-transmitting area 103, part of the data lines 15 passing the light-transmitting area 103 needs to be wound around the light-transmitting area 103, thus forming the arc portion of the data line 15. The arc portion of the data line 15 at least partially passes under the orthographic projection of the second sub-opening 212.

In some embodiments, the signal lines 15 further include scanning lines 151 such as gate lines, light-emitting control signal lines, reset lines. These scanning lines 151 extend originally in the horizontal direction, but the part of the scanning lines 151 passing the light-transmitting area 103 needs to be wound around the light-transmitting area 103, thereby forming the arc portion of the scanning line 151. The arc portion of the scanning line 151 at least partially passes under the orthographic projection of the second sub-opening 211.

In some embodiments, as shown in FIG. 8, arc portions of a plurality of signal lines 15 are correspondingly distributed below the distribution area of the second sub-opening 212. For example, the arc portions of the signal lines 15 include arc portions of the data lines 150, the arc portions of the data lines 150 are distributed in two layers, one layer is in the same layer as the source electrode 29 and the drain electrode 30, and the other layer is in the same layer as the conductive layer 32. Since the arc portions of the data lines 150 are distributed in two layers, frame space of the display substrate can be saved. The arc portions of the data lines 150 may also be distributed in multiple layers, and the data lines 150 in each layer and the metal conductive film layer in the same layer may be formed using the same material by a single process. Alternatively, in a case where the display substrate has other metal layer structures (e.g., an LTPO panel has metal structure such as a gate layer of an oxide transistor and a transfer layer), or the display substrate has other transfer metal layers, multi-layer wiring structure of the signal lines may be used to save the frame space of the display substrate. The arc portion of the signal line 15 may also include the arc portion of the scanning line 151, and the arc portion of the scanning line 151 may also be distributed in two or more layers. As shown in FIG. 8, the arc portion of the scanning line 151 is distributed in two layers, one layer is the arc portion of the gate line in the same layer as the gate electrode 20 and the first scanning line 25, and the other layer is the winding of the light-emitting control signal line in the same layer as the second scanning line 27. The arc portion of the scanning line 151 has the multi-layer wiring structure, so that the frame space of the display substrate is saved. The arc portion of the scanning line 151 may also be distributed in multiple layers, and the scanning line 151 in each layer and the metal conductive film layer in the same layer may be formed using the same material by a single process.

It should be noted that, when the scanning lines 151 are in dual-side driving mode, the scanning lines 151 do not need to be wound at the light-transmitting area 103, that is, no arc portion needs to be provided.

In some embodiments, as shown in FIGS. 5 and 6, in the radial direction of the light-transmitting area 103, a width L of the distribution area of the second sub-openings 212 ranges from 2 to 8 times a width of the second sub-opening 212 in the radial direction thereof. The width of the second sub-opening 212 in the radial direction thereof refers to the size of a maximum opening of the second sub-opening 212 in the radial direction of the light-transmitting area 103. For example, in a case where the second sub-opening 212 has a shape of circle, the width of the second sub-opening 212 in the radial direction thereof is the diameter of the circle. In a case where the second sub-opening 212 has a shape of rectangle, the width of the second sub-opening 212 in the radial direction thereof is the length of the wide side of the rectangle, that is, the wide side of the second sub-opening 212 extends in the radial direction of the light-transmitting area 103. The same applies to the second sub-opening 212 having any other shape. The second sub-openings 212 are distributed around the light-transmitting area 103, the distribution area of the second sub-openings 212 refers to an annular area in which the second sub-openings 212 are distributed around the light-transmitting area 103, and the width L of the distribution area of the second sub-openings 212 refers to a distance between an inner ring and an outer ring of the annular area in a radial direction of the light-transmitting area 103. In some embodiments, the width of the second sub-opening 212 along the radial direction thereof ranges from 5 μm to 40 μm, for example, the width of the second sub-opening 212 along the radial direction thereof ranges from 7 μm to 8 μm, 20 μm to 30 μm, or the like, and the width of the distribution area of the second sub-opening 212 ranges from 10 μm to 320 μm. In some embodiments, the size difference between the first sub-opening 211 and the second sub-opening 212 is less than a set threshold. The set threshold may be 0 or a value close to 0. That is, the first sub-opening 211 and the second sub-opening 212 are approximately identical in size. In some embodiments, the first sub-openings 211 and the second sub-openings 212 have the same arrangement uniformity. The arrangement uniformity of the first sub-openings 21 refers to the distribution density of the first sub-openings 211 in the display area 101, i.e. the density of the first sub-openings 211 in the display area 101; the arrangement uniformity of the second sub-openings 212 refers to the distribution density of the second sub-openings 212 in the annular area in which the second sub-openings 212 are arranged around the light-transmitting area 103, that is, the density of the second sub-openings 212 in the annular area in which the second sub-openings 212 are arranged. With the arrangement, the sizes of the first sub-openings 211 at the boundary 100 between the display area 101 and the non-display area 102 can be well ensured to be uniform, so that the display effect of the display substrate can be well ensured.

In some embodiments, the display substrate further includes a partition 24, the partition 24 is located in the non-display area 102 and at least partially surrounds the light-transmitting area 103 at the edge of the light-transmitting area 103, and the second sub-openings 212 are distributed around the partition 24 on a side of the partition 24 away from the light-transmitting area 103. The shortest distance M between the partition 24 and the distribution area of the second sub-openings 212 is greater than 0 and less than 300 microns. The partition 24 is formed by forming a first groove 23 in a portion of the insulating layer (e.g., a planarization layer, a pixel defining layer, a support layer) at the edge of the light-transmitting area 103. The width E of the first groove 23 among grooves 23 close to the second sub-opening 212 ranges from 40 μm to 80 μm, so that the distance F between an edge of the first groove 23 close to the second sub-opening 212 and the distribution area of the second sub-openings 212 is greater than 0 and less than 260 μm; alternatively, the distance F between the edge of the first groove 23 close to the second sub-opening 212 and the distribution area of the second sub-openings 212 is greater than 0 and less than 220 μm. The distribution area of the second sub-openings 212 refers to an annular area in which the second sub-openings 212 are distributed around the light-transmitting area 103. The shortest distance between the partition 24 and the distribution area of the second sub-openings 212 refers to the distance between the outer rim of the partition 24 away from the light-transmitting area 103 and the inner rim of the annular distribution area of the second sub-openings 212 close to the light-transmitting area 103. Compared with the case that sub-pixel openings are formed in the pixel defining layer in only the display area in prior art, the distance M is far smaller than the distance between the sub-pixel opening and the groove in the pixel defining layer in the prior art, namely the area of the pixel defining layer reserved between the partition 24 and the distribution area of the second sub-openings 212 is smaller, so that the gas released from the internal film layer of the display substrate during and after the process can be discharged timely through the first groove 23 and the second sub-opening 212, so as to avoid the released gas getting stuck between certain internal film layers to form small gaps or small cavities, thereby avoiding the adverse effects caused by each film layer absorbing water vapor through the small gaps or small cavities during the fabrication process.

In some embodiments, as shown in FIG. 8, the partition 24 is generally composed of at least two organic layers, such as a planarization layer, a pixel defining layer, a support layer 33, etc., but is not limited to this structure, as long as the partition 24 can satisfy a certain height to block the organic encapsulation layer 612 from overflowing. The partition 24 may be provided in the form of one annulus or two annuluses. If the partition 24 is provided in the form of two annuluses, the shortest distance between the partition 24 and the distribution area of the second sub-openings 212 refers to the distance between the outer rim, away from the light-transmitting area 103, of one partition 24 closest to the distribution area of the second sub-openings 212, and the inner rim, close to the light-transmitting area 103, of the annular distribution area of the second sub-openings 212. A support layer 33 and spacers in the display area 101 may be formed by a single process using the same material. Alternatively, the support layer 33 may be formed separately by one process using an organic resin material.

In some embodiments, the partition 24 is used for encapsulating the substrate area around the light-transmitting area 103. Specifically, when the substrate area around the light-transmitting area 103 is encapsulated, the encapsulation film layer and the partition 24 are correspondingly pressed together to encapsulate the substrate area around the light-transmitting area 103.

In some embodiments, as shown in FIG. 10, when the display substrate is viewed from a top view, isolation pillars 16 are further disposed between the partition 24 and the arc portions of the signal lines 15. In addition, the isolation pillars 16 are further provided on a side of the partition 24 away from the arc portions of the signal lines 15 (i.e., on a side of the partition 24 close to the light-transmitting area 103). The isolation pillars 16 serve to cut off the conductive film layer (e.g., the second electrode layer) on the side of the pixel defining layer away from the substrate.

Figure 11:
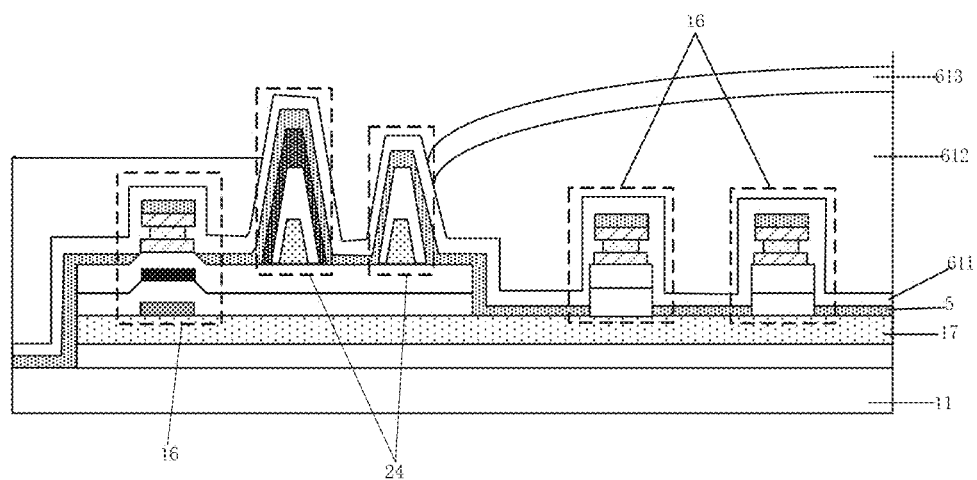
FIG. 11 is a schematic cross-sectional view of a structure of an isolation pillar in a display substrate according to an embodiment of the present disclosure.

In some embodiments, the isolation pillar 16 may be an isolation trench structure as shown in FIG. 8. In some embodiments, the isolation pillar 16 may also be a convex isolation structure as shown in FIG. 11, which may actually be a I-shaped isolation pillar formed of a source drain metal layer on the substrate side.

Figure 12:
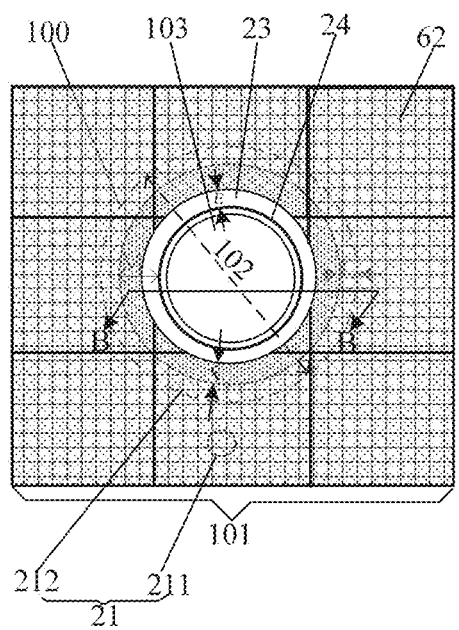
FIG. 12 is a top view of a structure of a display substrate provided with a touch film layer according to an embodiment of the present disclosure.
Figure 13:
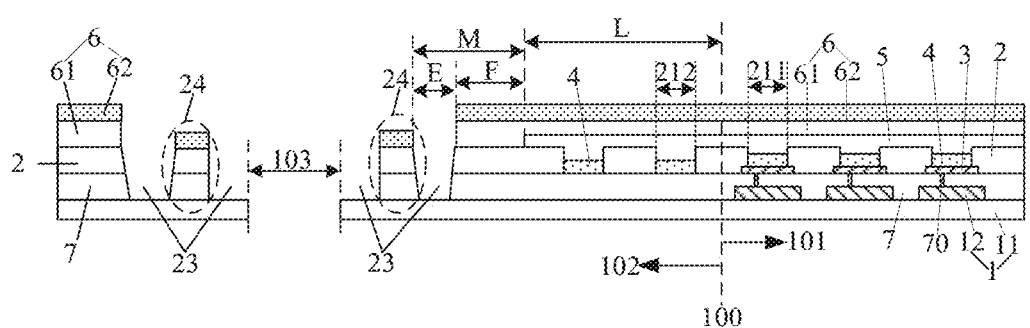
FIG. 13 is a cross-sectional view of a structure of the display substrate shown in FIG. 7 taken along line BB.

In some embodiments, as shown in FIG. 12 and FIG. 13, the display substrate further includes a touch film layer 6, and the touch film layer 6 is disposed on a side of the second electrode layer 5 away from the substrate 1. The touch film layer 6 includes touch electrodes 62, the touch electrode 62 is in a grid shape, the pixel defining layer 2 is in a grid shape, and an orthographic projection of the touch electrode 62 on the substrate 1 at least partially overlaps with an orthographic projection of the pixel defining layer 2 on the substrate 1. Because the second sub-openings 212 in the pixel defining layer 2 are distributed in the area of the non-display area 102 close to the boundary 100 between the display area 101 and the non-display area 102, under the condition that the size of the light-transmitting area 103 is large enough to place an under-screen detection device, the distance from the first groove 23 in the pixel defining layer 2 to the boundary 100 can be set to be large enough, so that the touch electrodes 62 can extend from the display area 101 to cover the edge of the first groove 23 of the non-display area 102 away from the light-transmitting area 103, and the pixel defining layer covered by the touch electrode 62 is flat, thereby not only avoiding the poor wiring of the touch electrode 62, but also improving the influence of the light-transmitting area 103 arranged in the non-display area 102 on the pattern integrity of the touch electrode 62. Meanwhile, since the second sub-openings 212 in the pixel defining layer 2 are disposed in the area of the non-display area 102 close to the boundary 100 between the display area 101 and the non-display area 102, the area of the pixel defining layer 2 reserved between the first groove 23 and the distribution area of the second sub-openings 212 is smaller, so that the gas released from the internal film layer of the display substrate during and after the process can be discharged timely through the first groove 23 and the first opening 21, so as to avoid the released gas getting stuck between certain internal film layers to form small gaps or small cavities, thereby avoiding the adverse effects of each film layer absorbing water vapor through the small gaps or small cavities during the fabrication process. That is, in the embodiments, the second sub-openings 212 in the pixel defining layer 2 are distributed in the non-display area 102, so that the arrangement that the touch electrode 62 is spread from the display area 101 to the first groove 23 of the non-display area 102 does not cause the defects of the film layers inside the display substrate due to moisture absorption in the fabrication process. In addition, the touch electrode 62 is designed in a grid shape, so that the etching uniformity in the fabrication process can be improved, and the capacitance compensation effect can be improved.

In some embodiments, as shown in FIGS. 7 and 8, the touch electrode 62 is disposed on a side of the insulating layer 61 away from the substrate 1. The touch electrode 62 includes a bridge structure 620, a first insulating layer 621, and a touch electrode pattern 622 (including driving electrodes and sensing electrodes) disposed on the inorganic buffer layer 614, and the driving electrode or the sensing electrode in the touch electrode pattern 622 is coupled to the bridge structure 620 through a via hole formed in the first insulating layer 621.

In some embodiments, an orthographic projection of the touch electrode 62 on the substrate at least partially overlaps with the orthographic projection, on the substrate, of the pixel defining layer 2 between the second sub-openings 212.

In some embodiments, a shape of an orthographic projection of the light-transmitting area 103 on the substrate 1 includes a circle, a rectangle, or a regular hexagon. Of course, the shape of the light-transmitting area 103 may be other shapes.

Figure 14:
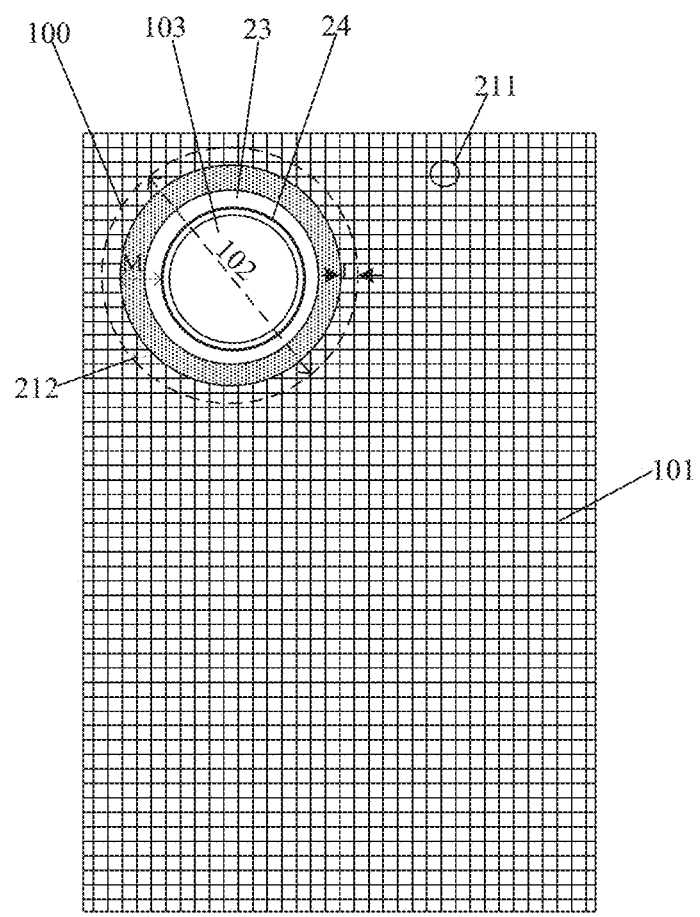
FIG. 14 is a schematic diagram illustrating another distribution of a display area and a non-display area of a display substrate according to an embodiment of the present disclosure.
Figure 15:
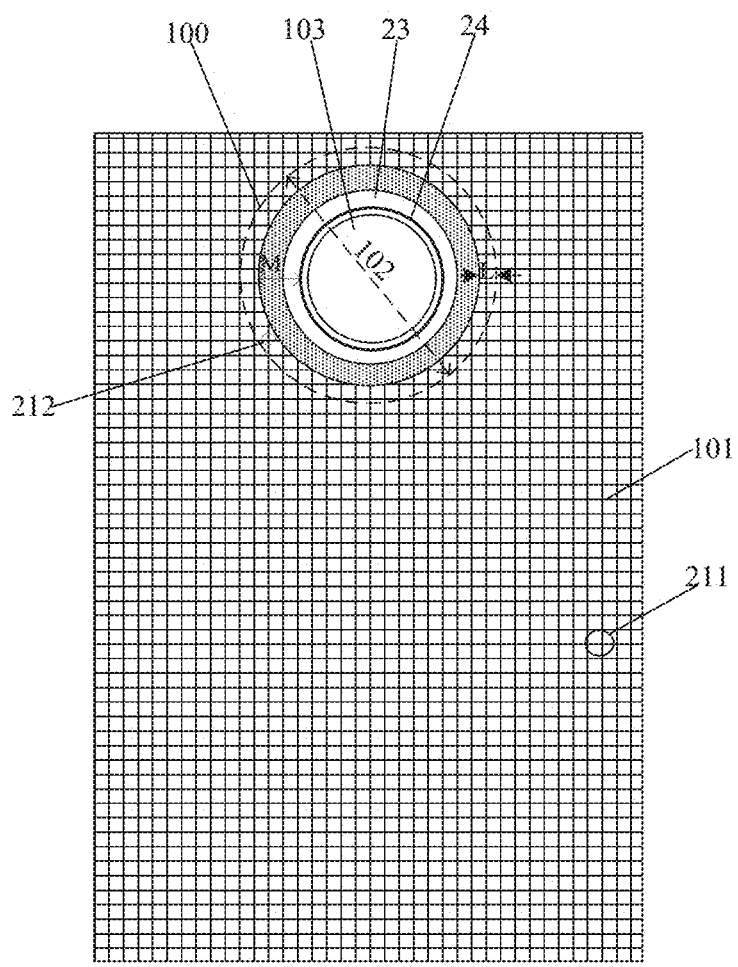
FIG. 15 is a schematic diagram illustrating further another distribution of a display area and a non-display area of a display substrate according to an embodiment of the present disclosure.

In some embodiments, the position relationship between the display area 101 and the non-display area 102 may also be: the display area 101 surrounds the periphery of the non-display area 102, as shown in FIG. 5; or, the non-display area 102 is located at one corner of the display area 101, as shown in FIG. 14; or, the non-display area 102 is located at one side of the display area 101. For example, the non-display area 102 is located in the middle area of one side of the substrate 1, and the display area 101 surrounds the periphery of the non-display area 102, as shown in FIG. 15.

Figure 16:
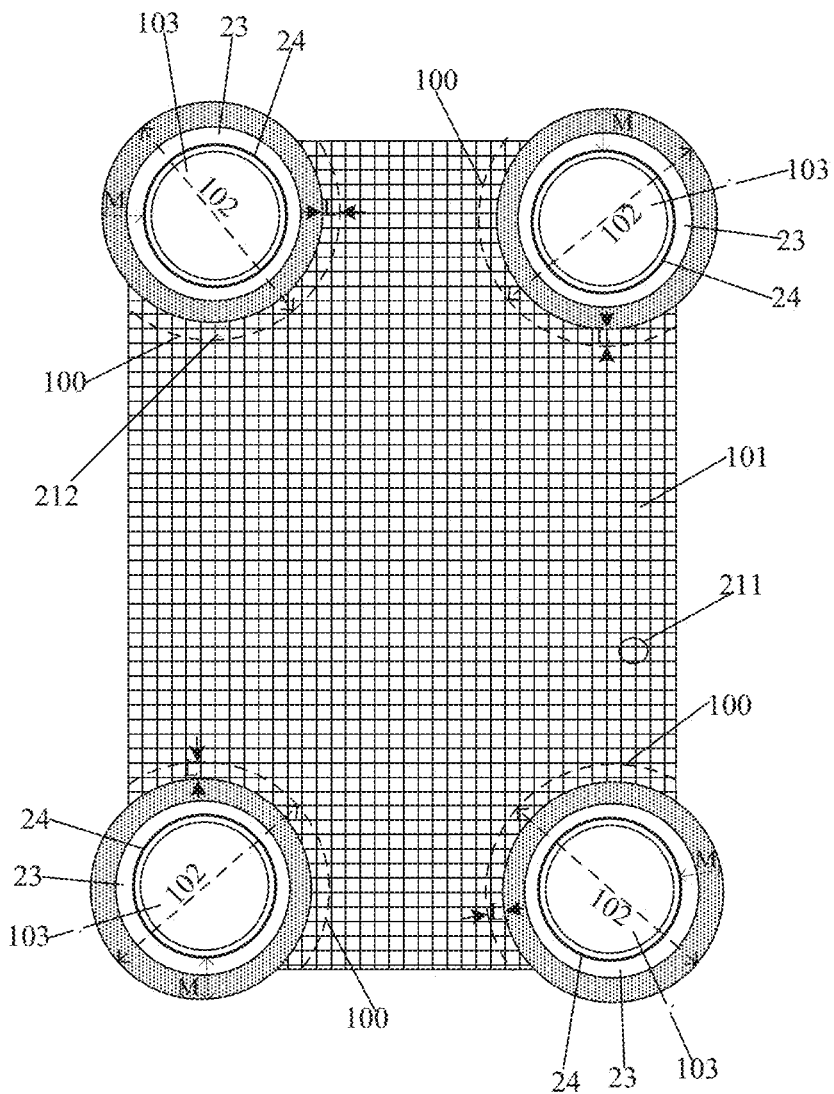
FIG. 16 is a schematic diagram illustrating yet another distribution of a display area and a non-display area of a display substrate according to an embodiment of the present disclosure.

In some embodiments, as shown in FIG. 16, the display area 101 may also be located in a central area of the substrate 1, and the non-display area 102 is disposed around the display area 101.

Based on the above structure of the display substrate, an embodiment of the present disclosure further provides a fabrication method of a display substrate, including preparing a substrate.

A pixel defining layer is formed on the substrate.

The display substrate further includes a display area, a non-display area and a light-transmitting area, the display area and the non-display area at least partially surround the light-transmitting area, and the pixel defining layer extends from the display area to the non-display area.

Forming the pixel defining layer includes: forming a pattern of the pixel defining layer, and forming a first opening in the pixel defining layer.

The first opening includes a plurality of first sub-openings and a plurality of second sub-openings, the plurality of first sub-openings are distributed in the display area, the plurality of second sub-openings are distributed in the non-display area, and the second sub-openings are closer to the light-transmitting area than the first sub-openings.

In some embodiments, the pattern of the pixel defining layer and the pattern of the first opening are formed by a single patterning process.

In this embodiment, conventional fabrication processes are adopted to form other film structures in the display substrate, which is not described herein.

In the display substrate according to the embodiment of the present disclosure, the first opening is formed in the pixel defining layer, the plurality of first sub-openings are distributed in the display area, and the plurality of second sub-openings are distributed in the non-display area. Compared with the case that sub-pixel openings are arranged in the pixel defining layer in only the display area in prior art, the second sub-openings are formed in the part of the pixel defining layer extending to the non-display area in the embodiment, so that the openings in the pixel defining layer can be spread and distributed to the area of the non-display area at the boundary between the non-display area and the display area, and the sizes of the first sub-openings at the boundary between the display area and the non-display area are uniform, namely the sizes of the first sub-openings at the boundary are the same as those of the first sub-openings in the display area, and thus the display effect of the display substrate can be ensured. Meanwhile, the second sub-openings are distributed in the non-display area, so that the distance between the partition and the distribution area of the second sub-openings is shortened, and the gas released from the internal film layer of the display substrate during and after the process can be discharged timely through the first groove and the second sub-opening, so as to avoid the released gas getting stuck between certain internal film layers to form small gaps or small cavities, thereby avoiding the adverse effects caused by each film layer absorbing water vapor through the small gaps or small cavities during the fabrication process. In addition, the second sub-openings are distributed in the non-display area, so that the touch electrode can extend from the display area to cover the edge of the first groove of the non-display area, and the pixel defining layer covered by the touch electrode is flat, thereby not only avoiding the poor wiring of the touch electrode, but also improving the influence of the light-transmitting area arranged in the non-display area on the pattern integrity of the touch electrode.

Figure 17:
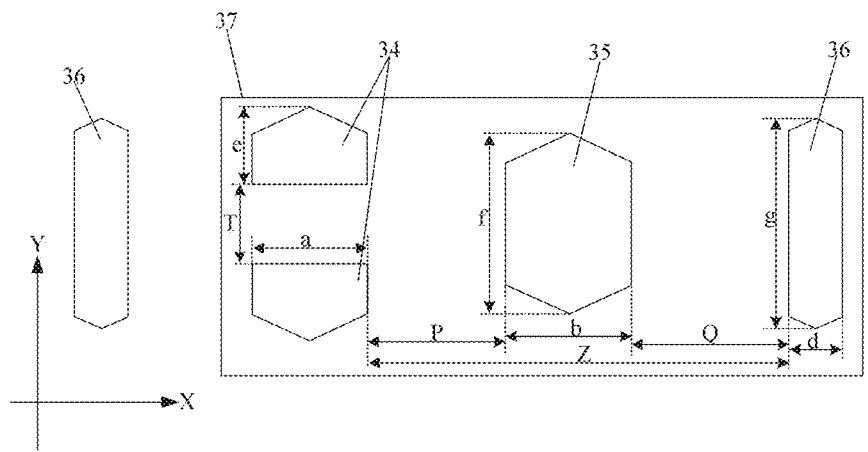
FIG. 17 is a top view of a structure of a second sub-opening in a non-display area of a display substrate according to another embodiment of the present disclosure.
Figure 18:
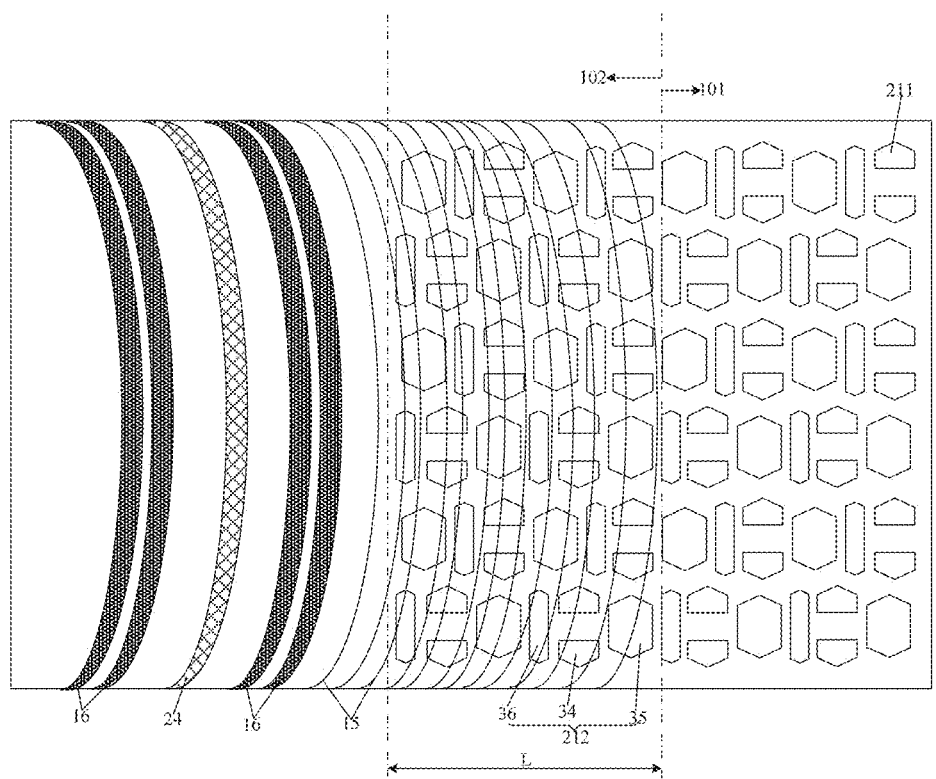
FIG. 18 is a schematic enlarged top view of another structure of the portion C of the display substrate shown in FIG. 5.

The present disclosure also provides a display substrate, as shown in FIG. 17 and FIG. 18, on the basis of the display substrate in the foregoing embodiments, in this embodiment, the second sub-openings 212 include a first-shape opening 34, a second-shape opening 35, and a third-shape opening 36, and the first-shape opening 34, the second-shape opening 35 and the third-shape opening 36 are of different shapes and sizes; two first-shape openings 34, one second-shape opening 35 and one third-shape opening 36 constitute one opening period 37, and a plurality of opening periods 37 are distributed in the non-display area.

In some embodiments, the first-shape opening 34 is pentagonal in shape, the second-shape opening 35 is hexagonal in shape, the third-shape opening 36 is hexagonal in shape, and the hexagonal shape of the second-shape opening 35 is different from the hexagonal shape of the third-shape opening 36. Of course, the shapes of the first-shape opening 34, the second-shape opening 35, and the third-shape opening 36 are not limited to the above-described shapes.

In some embodiments, in the same opening period 37, two first-shape openings 34 are mirror-symmetrical with the horizontal X-axis direction as the symmetry axis; the first-shape openings 34, the second-shape openings 35, and the third-shape openings 36 are arranged at intervals in this order in the X-axis direction. Of course, the arrangement of the openings of respective shapes in the opening period 37 is not limited to the above arrangement.

In some embodiments, the first sub-opening 211 in the display area has the same configuration and shape as the second sub-opening 212. The first-shape opening 34 is used to accommodate a green sub-pixel, the second-shape opening 35 is used to accommodate a blue sub-pixel, and the third-shape opening 36 is used to accommodate a red sub-pixel.

In some embodiments, in the opening period 37, a distance T between two first-shape openings 34 ranges from 6 µm to 27 µm, a distance P between the first-shape opening 34 and the second-shape opening 35 ranges from 15 µm to 30 µm, a distance Q between the second-shape opening 35 and the third-shape opening 36 ranges from 15 µm to 30 µm, and a distance Z between the first-shape opening 34 and the third-shape opening 36 ranges from 50 µm to 80 µm. The distance T between the two first-shape openings 34 is the shortest straight-line distance between two adjacent sides of the two first-shape openings 34, which are parallel to the X-axis and mirror-symmetrical with the X-axis as the symmetry axis. The distance P between the first-shape opening 34 and the second-shape opening 35, the distance Q between the second-shape opening 35 and the third-shape opening 36, and the distance Z between the first-shape opening 34 and the third-shape opening 36 each are the shortest straight-line distance between two adjacent sides of the openings of two shapes in the Y-axis direction perpendicular to the X-axis.

In some embodiments, in the opening period 37, the distance T between two first-shape openings 34 is 16.5 µm, the distance P between the first-shape opening 34 and the second-shape opening 35 is 26 µm, the distance Q between the second-shape opening 35 and the third-shape opening 36 is 26 µm, and the distance Z between first-shape opening 34 and third-shape opening 36 is 72 µm.

In some embodiments, in the opening period 37, a width a of the first-shape opening 34 along the X-axis direction is in a range of 15 µm to 30 µm. Optionally, for example, the width a of the first-shape opening 34 in the X-axis direction is 20 µm. A width b of the second-shape opening 35 along the X-axis direction is in a range of 15 µm to 30 µm. Optionally, the width b of the second-shape opening 35 in the X-axis direction is 22 µm. A width d of the third-shape opening 36 in the X-axis direction ranges from 6 µm to 15 µm. Optionally, the width d of the third-shape opening 36 in the X-axis direction is 10 µm. The width of the opening of each shape along the X-axis direction means the maximum size of the opening along the X-axis direction.

In some embodiments, in the opening period 37, the width a of the first-shape opening 34 is 1 to 1.2 times the width b of the second-shape opening 35, and the width b of the second-shape opening 35 is 1.5 to 2 times the width d of the third-shape opening 36.

In some embodiments, in the opening period 37, a length e of the first-shape opening 34 along the Y-axis direction ranges from 5 µm to 25 µm. Optionally, for example, the length e of the first-shape opening 34 along the Y-axis direction is 16 µm. A length f of the second-shape opening 35 in the Y-axis direction ranges from 10 µm to 50 µm. Optionally, the length f of the second-shape opening 35 along the Y-axis direction is 35 µm. A length g of the third-shape opening 36 along the Y-axis direction ranges from 15 µm to 60 µm.

Optionally, the length g of the third-shape opening 36 along the Y-axis direction is 45 µm. The length of the opening of each shape along the Y-axis direction means the maximum size of the opening along the Y-axis direction.

In some embodiments, in the opening period 37, the length e of the first-shape openings 34 is 0.5 to 0.7 times the length f of the second-shape openings 35, and the length f of the second-shape opening 35 is 0.8 to 1 times the length g of the third-shape opening 36.

In some embodiments, in the opening period 37, the area of the first-shape opening 34 is 0.5 to 0.7 times the area of the second-shape openings 35, and the area of the second-shape opening 35 is 1.5 to 2 times the area of the third-shape opening 36. The area of the opening of each shape means the area of the orthographic projection of the opening on the substrate.

In some embodiments, the areas of the openings having the same shape are the same in the non-display area and the display area.

In some embodiments, the area of the opening of each shape in the non-display area is 1.1 to 1.5 times the area of each opening of the same shape in the display area.

In some embodiments, the area of the opening of each shape in the non-display area is 0.6 to 0.9 times the area of each opening of the same shape in the display area.

As described above, the proportion setting of areas of the openings having the same shape in the non-display area and the display area can ensure that the sizes of the first sub-openings at the boundary between the display area and the non-display area are uniform, so that the gas released from the internal film layer of the display substrate during and after the process can be discharged timely through the first groove and the second sub-opening, so as to avoid the released gas getting stuck between certain internal film layers to form small gaps or small cavities, thereby avoiding the adverse effects of each film layer absorbing water vapor through the small gaps or small cavities during the fabrication process.

Other structures and fabrication methods of the display substrate in this embodiment are the same as those in the above embodiments, and are not described herein.

The embodiment of the present disclosure further provides a display panel, which includes the display substrate described above.

By adopting the display substrate, the display effect of the display panel can be improved, and defects caused by water absorption of the display panel in the fabrication process can be avoided.

The display panel according to the embodiment of the present disclosure can be any product or component with a display function, such as an OLED panel, an OLED television, a display, a mobile phone, a navigator and the like.

It could be understood that the above embodiments are merely exemplary embodiments adopted for describing the principle of the present disclosure, but the present disclosure is not limited thereto. Various variations and improvements may be made by those of ordinary skill in the art without departing from the spirit and essence of the present disclosure, and these variations and improvements shall also be regarded as falling into the protection scope of the present disclosure.

The present disclosure is based on the PCT international application No. PCT/CN2020/114589 filed on Sep. 10, 2020, which is hereby incorporated by reference in its entirety for all purposes, and claims priority according to the relevant legislation in the patent law.

What is claimed is:
1. A display substrate, comprising:
    a substrate; and
    a pixel defining layer on the substrate, wherein the display substrate further comprises a display area, a non-display area and a light-transmitting area, the display area and the non-display area at least partially surrounding the light-transmitting area,
the pixel defining layer extends from the display area to the non-display area, and
the pixel defining layer is provided with a first opening therein, the first opening comprises a plurality of first sub-openings and a plurality of second sub-openings, the plurality of first sub-openings are in the display area, the plurality of second sub-openings are in the non-display area, and the plurality of second sub-openings are closer to the light-transmitting area than the plurality of first sub-openings.

2. The display substrate according to claim 1, wherein the plurality of first sub-openings each are provided with a first electrode layer and a light-emitting function layer therein;
the substrate comprises a pixel circuit, the pixel circuit comprising a driving transistor electrically coupled to the first electrode layer;
the first electrode layer and the light-emitting function layer are stacked in a direction away from the substrate;
the plurality of second sub-openings each are provided with the light-emitting function layer therein;
the display substrate further comprises a second electrode layer on a side of the pixel defining layer away from the substrate, and the second electrode layer covers the plurality of first sub-openings and the plurality of second sub-openings; and
an orthographic projection of the driving transistor on the substrate does not overlap with an orthographic projection of each of the plurality of second sub-openings on the substrate.

3. The display substrate according to claim 1, wherein the display substrate further comprises a signal line on a side of the pixel defining layer close to the substrate, the signal line extending from the display area to the non-display area, and the signal line comprising an arc portion in the non-display area; and
the arc portion is at least partially around the light-transmitting area, and an orthographic projection of the arc portion on the substrate at least partially overlaps with an orthographic projection of the plurality of second sub-openings on the substrate.

4. The display substrate according to claim 3, wherein the signal line comprises a data line.

5. The display substrate according to claim 2, wherein a width of a distribution area of the plurality of second sub-openings along a radial direction of the light-transmitting area is in a range of 2 to 8 times a width of the plurality of second sub-openings along the radial direction.

6. The display substrate according to claim 1, wherein the display substrate further comprises a partition in the non-display area and at least partially surrounding the light-transmitting area;
the partition surrounds the light-transmitting area at an edge of the light-transmitting area, and the plurality of second sub-openings surround the partition and are on a side of the partition away from the light-transmitting area; and
a shortest distance between the partition and a distribution area of the plurality of second sub-openings is more than 0 and less than 300 microns.

7. The display substrate according to claim 2, further comprising a touch film layer on a side of the second electrode layer away from the substrate, wherein the touch film layer comprises a touch electrode in a grid shape, and an orthographic projection of the touch electrode on the substrate at least partially overlaps with an orthographic projection of the pixel defining layer on the substrate.

8. The display substrate according to claim 7, wherein the orthogonal projection of the touch electrode on the substrate at least partially overlaps with an orthogonal projection of the pixel defining layer, between the plurality of second sub-openings, on the substrate.

9. The display substrate according to claim 1, wherein a size difference between the plurality of first sub-openings and the plurality of second sub-openings is smaller than a set threshold.

10. The display substrate according to claim 1, wherein the plurality of second sub-openings comprise a first-shape opening, a second-shape opening, and a third-shape opening;
the first-shape, second-shape, and third-shape openings have different sizes; and
two first-shape openings, one second-shape opening, and one third-shape opening constitute one opening period, and a plurality of opening periods are in the non-display area.

11. The display substrate according to claim 10, wherein in the opening period,
a distance between two first-shape openings ranges from 6 μm to 27 μm;
a distance between the first-shape opening and the second-shape opening ranges from 15 μm to 30 μm;
a distance between the second-shape opening and the third-shape opening ranges from 15 μm to 30 μm; and
a distance between the first-shape opening and the third-shape opening ranges from 50 μm to 80 μm.

12. The display substrate according to claim 10, wherein the distance between the first-shape opening and the third-shape opening is 1.5 to 2.5 times the distance between the first-shape opening and the second-shape opening;
the distance between the first-shape opening and the second-shape opening is 0.8 to 1.2 times the distance between the second-shape opening and the third-shape opening; and
the distance between two first-shape openings is 0.6 to 1 times the distance between the first-shape opening and the second-shape opening.

13. The display substrate of claim 1, wherein the plurality of first sub-openings and the plurality of second sub-openings are arranged with a same uniformity.

14. The display substrate according to claim 1, wherein the display area surrounds the non-display area at a periphery of the non-display area; or
the non-display area is at a corner of the display area; or
the non-display area is at an edge of the display area.

15. The display substrate according to claim 2, further comprising a planarization layer on a side of the pixel defining layer close to the substrate, wherein
the substrate further comprises a base, the pixel circuit is on the base, the planarization layer is provided with a via hole therein, and the first electrode layer is coupled to the driving transistor in the pixel circuit through the via hole.

16. A display panel, comprising the display substrate of claim 1.

17. A method for fabricating a display substrate, comprising:
preparing a substrate; and forming a pixel defining layer on the substrate, wherein the display substrate further comprises a display area, a non-display area and a light-transmitting area, the display area and the non-display area at least partially surrounds the light-transmitting area, and the pixel defining layer extends from the display area to the non-display area;

forming the pixel defining layer comprises: forming a pattern of the pixel defining layer, and forming a first opening in the pixel defining layer; and the first opening comprises a plurality of first sub-openings and a plurality of second sub-openings, the plurality of first sub-openings are in the display area, the plurality of second sub-openings are in the non-display area, and the plurality of second sub-openings are closer to the light-transmitting area than the plurality of first sub-openings.

18. The method of fabricating the display substrate according to claim 17, wherein the pattern of the pixel defining layer and a pattern of the first opening are formed by a single patterning process.

* * * * *